(12) United States Patent
Lin et al.

(10) Patent No.: US 6,637,501 B2
(45) Date of Patent: Oct. 28, 2003

(54) HEAT DISSIPATION DEVICE

(75) Inventors: Tsu-Liang Lin, Taoyuan Sien (TW); Bor Haw Chang, Taoyuan Sien (TW); Yu-Hung Huang, Taoyuan Sien (TW); Wen-Shi Huang, Taoyuan Sien (TW)

(73) Assignee: Delta Electronics Inc. (TW)

( * ) Notice: Subject to any disclaimer, the term of this patent is extended or adjusted under 35 U.S.C. 154(b) by 0 days.

(21) Appl. No.: 10/107,436

(22) Filed: Mar. 28, 2002

(65) Prior Publication Data

US 2003/0015311 A1 Jan. 23, 2003

(30) Foreign Application Priority Data

Jul. 17, 2001 (TW) ........................................ 90212056 U

(51) Int. Cl.$^7$ .................................................. F28F 7/00
(52) U.S. Cl. ...................... 165/80.3; 165/121; 165/125; 165/122; 361/697; 257/721
(58) Field of Search .................. 165/80.3, 121, 165/122, 125, 185; 361/697; 257/721, 722

(56) References Cited

U.S. PATENT DOCUMENTS

| | | | | |
|---|---|---|---|---|
| 5,699,854 A | * | 12/1997 | Hong | 165/122 |
| 5,898,568 A | * | 4/1999 | Cheng | 165/122 |
| 5,940,269 A | * | 8/1999 | Ko et al. | 165/122 |
| 6,109,890 A | * | 8/2000 | Horng | 165/122 |
| 6,125,924 A | * | 10/2000 | Lin | 165/122 |
| 6,170,563 B1 | * | 1/2001 | Hsieh | 165/122 |
| 6,243,263 B1 | * | 6/2001 | Kitahara | 165/122 |
| 6,460,608 B1 | * | 10/2002 | Katsui | 165/80.3 |

* cited by examiner

*Primary Examiner*—Christopher Atkinson
(74) *Attorney, Agent, or Firm*—Birch, Stewart, Kolasch & Birch, LLP

(57) ABSTRACT

The present heat dissipation device is provided with a fan frame and a blade structure. The fan frame includes an air inlet, an air outlet, and a curved portion. The air inlet has a non-circular indentation in the vicinity of the curved portion corresponding to the airflow passage. This indentation effectively increases the airflow amount and static pressure of the airflow expelled from the heat dissipation device.

4 Claims, 5 Drawing Sheets

HEAT DISSIPATION DEVICE

BACKGROUND OF THE INVENTION

1. Field of the Invention

The present invention relates to a heat dissipation device, particularly to an improved heat dissipation device suitable for use with a CPU.

2. Description of the Related Art

A conventional fan, as shown in FIG. 1, includes a fan frame 10 and a blade structure 20. The fan frame 10 has a circular air inlet 11 matching the blade structure 20 and an air outlet 12. The blade structure 20 further includes a hub 21, a base plate 22, and a plurality of blades 23 formed thereon. The blades 23 transfer the intake airflow parallel to the axial direction of the blade structure 20 to the outward airflow along the radial direction of the hub 21, and the outward airflow is then expelled.

Due to the increasing production of electronic components and in order to enhance heat dissipation efficiency, it is possible to enlarge the airflow passage to increase the airflow amount. However, the method described above can not be implemented in a limited space. As well, based on experience or a distribution diagram of equivalent pressure (not shown) obtained by experiment, an air outflow in a curved portion 14 of the fan frame 10 will further interfere with the intake airflow of the air inlet and the later air outflow due to adverse airflow, creating many problems such as unbalanced air outflow, noise, and decreased air outflow.

Therefore, it is necessary to have a novel heat dissipation device to solve the foregoing problems and to increase the air outflow to enhance heat dissipation efficiency.

SUMMARY OF THE INVENTION

An object of the invention is to provide a heat dissipation device, wherein the air inlet has a noncircular indentation in the vicinity of the curved portion corresponding to the airflow passage. This indentation effectively increases the air outflow and static pressure of the airflow expelled from the heat dissipation device.

Another object of the invention is to provide a heat dissipation device which improves the interference between the intake airflow and the air outflow both in the air inlet and the air outlet, and effectively increases the air outflow so as to enhance efficiency under the same rotation speed of the fan.

The first embodiment of the invention disposes a heat dissipation device having a centrifugal fan. The fan includes a fan frame and blade structure. The blade structure is disposed in the recess of the fan frame. This airflow passage is the route through which the air flows from the air inlet to the air outlet. There is no definite configuration for the blade structure, for example, a centrifugal blade structure having a hub, a base plate, and a plurality of blades formed on the base plate.

The fan frame also includes an air inlet and outlet, or the fan frame can alternatively be comprised of a pedestal and a cap. The cap has an air inlet, and the pedestal has an air outlet. It should be noted that the air inlet of the invention has an indentation in the vicinity of the curved portion of the fan frame, and the indentation extends toward the air outlet such that a part of the air inlet has a non-arc configuration while the other part has an arc configuration. The indentation is used to dissipate the adverse airflow so as to balance the air outflow and enhance the efficiency of heat dissipation.

According to measurements, the fan of the invention increases air outflow by at least 20% compared to that of a conventional fan (the configuration of the airflow inlet is circular) with the same dimensions as the present fan. Therefore, the invention can obtain the same air outflow with a lower rotation speed, and thus suppress the noise.

The second embodiment of the invention is a heat dissipation module including a blade structure. The heat dissipation module is disposed adjacent to a heat source; for example, the heat dissipation module is disposed on the lateral side of a central processing unit (CPU). The second embodiment of the invention includes a fan frame and a blade structure, wherein the fan frame has an airflow outlet and a non-circular airflow inlet, and alternatively has a cap.

The blade structure is not limited to a certain configuration; it can be an axial or a centrifugal configuration. In this embodiment, the blade structure has a centrifugal blade configuration, which includes a hub, a base plate and a plurality of blades formed on the base plate. The blade structure is disposed in the recess of the fan frame. The airflow passage is the route through which the air flows from the air inlet to the air outlet. The blades transfer the intake airflow parallel to the axial direction of the blade structure to the outward airflow along the radial direction of the hub, and the outward airflow is then expelled.

Similar to the first embodiment, the curved portion of the fan frame in the second embodiment has an indentation. The indentation extends toward the air outlet such that a part of the air inlet has a non-arc configuration. The indentation dissipates the adverse airflow in the airflow passage in the vicinity of the curved portion to prevent the adverse airflow from interfering with the intake airflow or with the later air outflow, such that the air outflow is more balanced and increased.

The heat dissipation module further includes a heat-conduction plate extended from a lateral wall of the fan frame to load a heat source; for example, a CPU disposed on the heat-conduction plate is adjacent to the heat dissipation module, such that the heat-conduction plate absorbs the heat from the CPU. Additionally, the air outlet of the heat dissipation module has a number of fins and the heat-conduction plate has a heat pipe adjacent to the heat source and extended to the fins. The heat pipe is formed to conduct the heat of the heat-conduction plate to the fins such that the blowing of the blade structure can dissipate the heat from the heat source.

DETAILED DESCRIPTION OF THE PREFERRED EMBODIMENT

The present invention provides a heat dissipation device. The special configuration of the air inlet suppresses the adverse airflow in the air passage adjacent to the curved portion such that the air outflow of the air outlet is more balanced and the efficiency of heat dissipation is enhanced.

The application of the invention is not limited to the centrifugal fan and the heat dissipation module. The detailed description of application of the invention is given below.

The First Embodiment

The first embodiment of the invention is described with a centrifugal fan.

Figure 1:
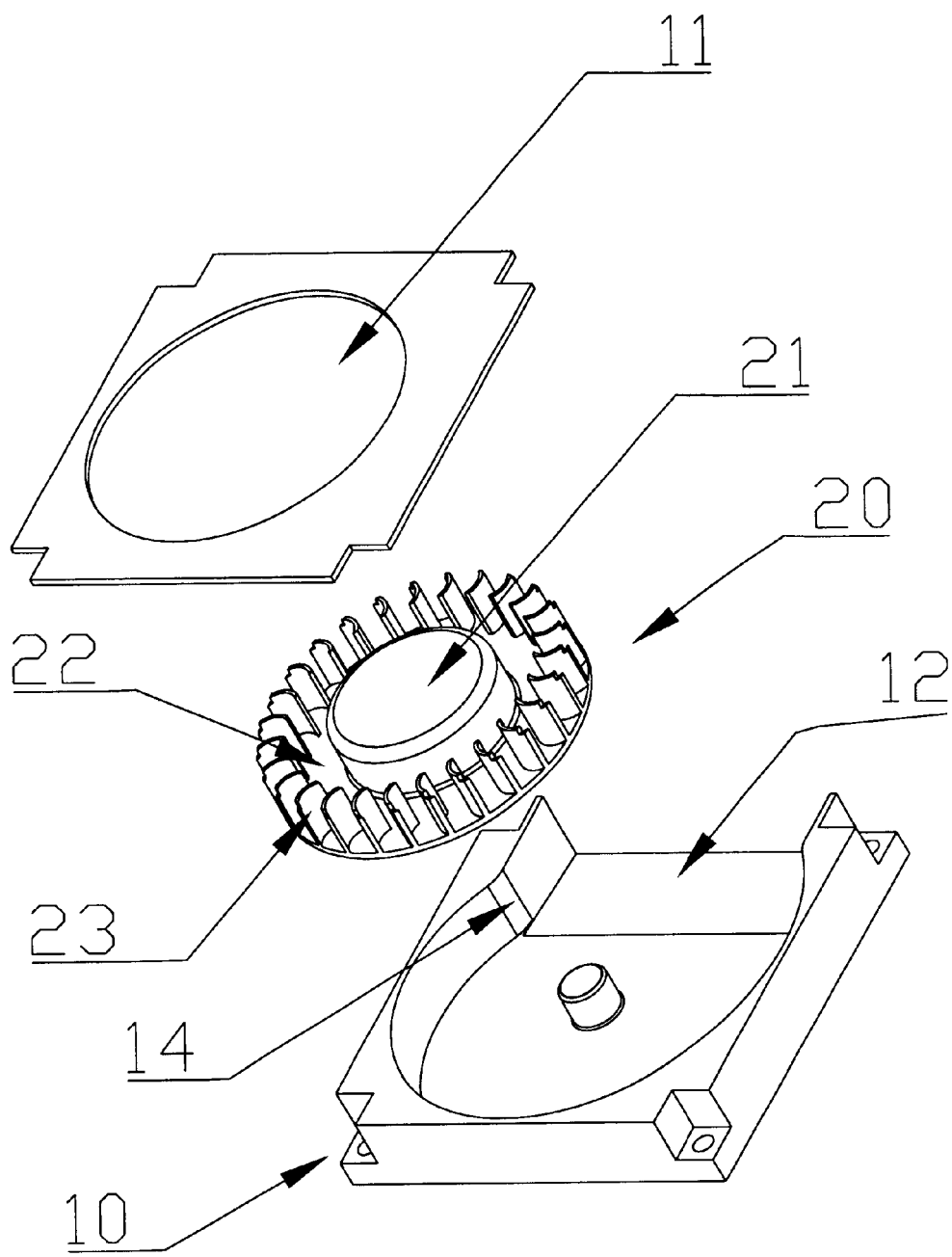
FIG. 1 shows an exploded view of a conventional fan.
Figure 2:
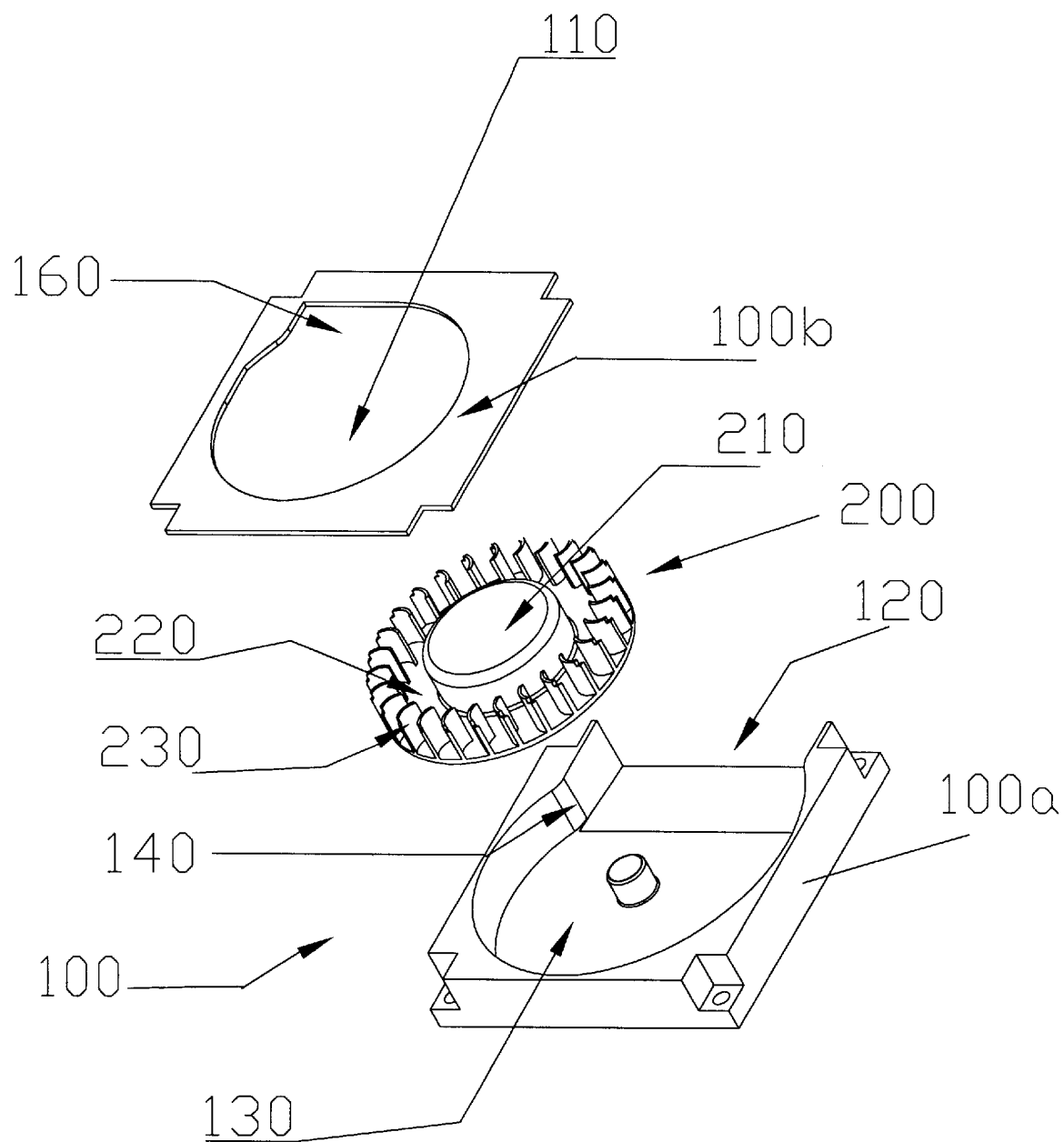
FIG. 2 is a schematic explosive view of the first embodiment of the invention.
Figure 3:
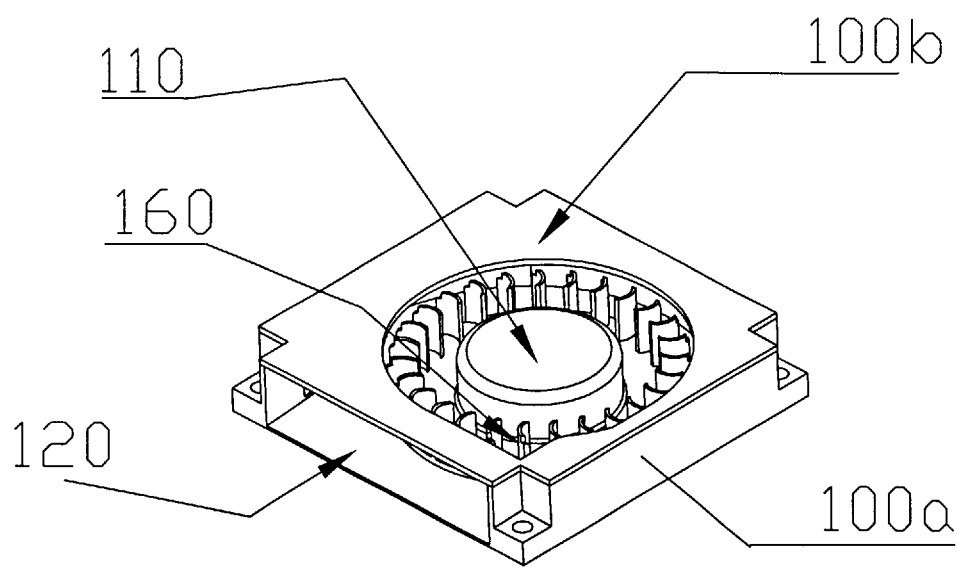
FIG. 3 is a schematic perspective view of the first embodiment of the invention.

Referring to FIG. 2 and FIG. 3, the fan of the invention includes a fan frame 100 and a blade structure 200. The blade structure 200 is disposed in a recess 130 of the fan frame 100. The airflow passage is the route through which the air flows from the air inlet to the air outlet. There is no definite configuration for the blade structure 200. In this embodiment, the blade structure 200 has a construction of centrifugal blades, which includes a hub 210, a base plate 220, and a plurality of blades 230 formed on the base plate 220. The blades 230 transfer the intake airflow parallel to the axial direction of the blade structure 200 to the outward airflow along the radial direction of the hub 210, and the outward airflow is then expelled.

Still referring to FIG. 2 and FIG. 3, the fan frame 100 has an air inlet 110 and an air outlet 120. The fan frame 100 can selectively be comprised of a pedestal 100*a* and a cap 100*b*. The cap 100*b* has an air inlet 110, and the pedestal 100*a* has an air outlet 120. Noticeably, an indentation 160 is formed in the air inlet 110 in the vicinity of the curved portion 140 of the fan frame 100. The indentation 160 extends toward the air outlet 120 such that a part of the configuration of the air inlet 110 is not an arc while the other part is an arc.

According to experience or a distribution diagram of equivalent pressure (not shown) obtained by experiment, the airflow in the vicinity of the curved portion 140 of the fan frame 100 usually flows back to the air inlet to interfere with the intake airflow and the later air outflow such that the air outflow is decreased and is not balanced. Therefore, the indentation 160 can be used to dissipate the adverse airflow so as to balance the air outflow and enhance the efficiency of heat dissipation. According to measurements, the air outflow of the invention increases at least 20% compared with that of a conventional fan (the air inlet has a circular configuration). Therefore, the invention can obtain the same air outflow by working at a lower rotational speed, and thus reduce the noise.

In order to verify the high efficiency of the invention, the fan of the invention is compared to a conventional fan in Table 1.

TABLE 1

|  | The invention | Conventional fan |
|---|---|---|
| Rotational speed (rpm) | 4000 | 4000 |
| $Q_{max}$ (CMM) | 0.154 | 0.125 |

According to the result shown in Table 1, if the conventional fan is required to have the same maximum airflow amount $Q_{max}$, its rotational speed should be increased to 4900 rpm. Therefore, the invention can obtain a higher air outflow by working at a lower rotational speed.

The Second Embodiment

Figure 4:
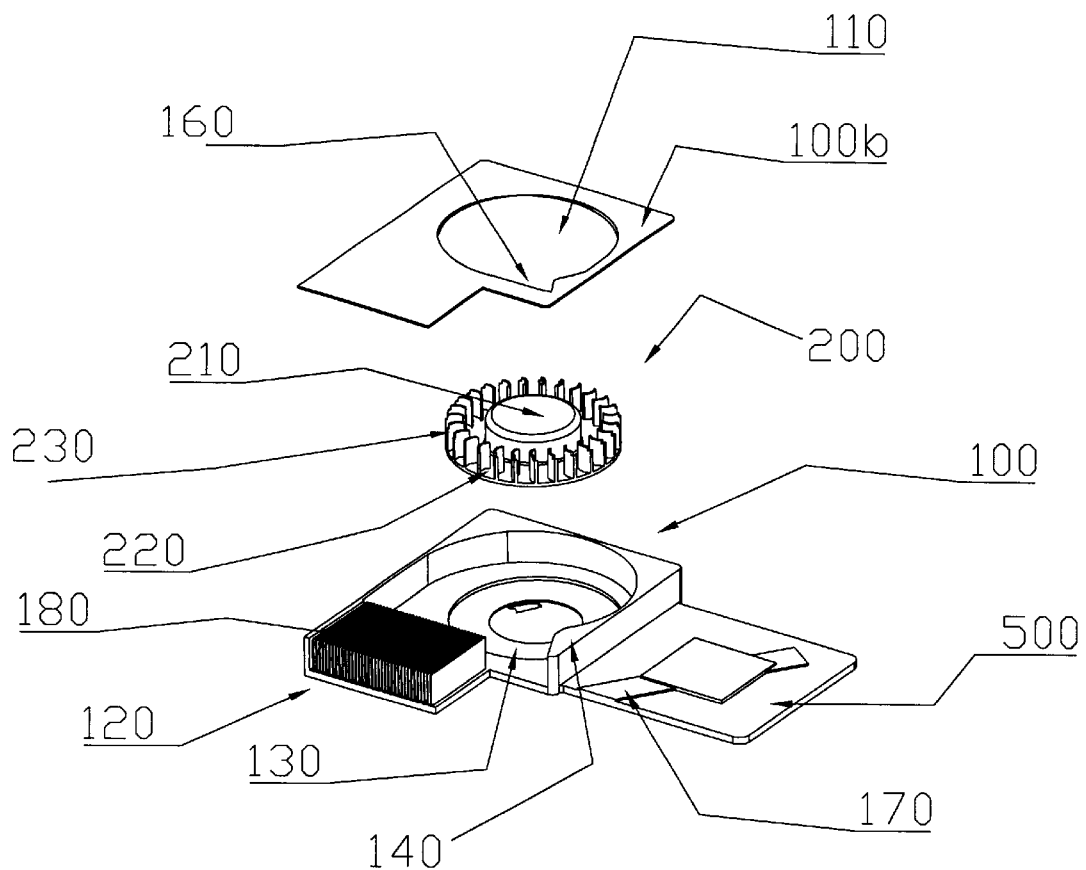
FIG. 4 is a schematic explosive view of the second embodiment of the invention.

The second embodiment of the invention is a heat dissipation module including a blade structure. Referring to FIG. 4, the heat dissipation module is adjacent to a heat source. For example, the heat dissipation module is disposed on the lateral side of a CPU (not shown). As shown in FIG. 4, The second embodiment of the invention includes a fan frame 100 and a blade structure 200. Additionally, the fan frame 100 has an air outlet 120 and a non-circular air inlet 110, and the fan frame 100 can selectively have a cap 100*b*. The fan frame 100 is a metallic material such as aluminum, aluminum alloy or aluminum-magnesium alloy.

Still referring to FIG. 4, the blade structure 200 does not have a limited configuration, and can be an axial blade structure or a centrifugal blade structure. In this embodiment, the blade structure 200 is a centrifugal blade structure including a hub 210, a base plate 220, and a plurality of blades 230 formed on the base plate 220. As well, the blade structure 200 is disposed in a recess 130 of the fan frame 100. The airflow passage is the route through which the air flows from the air inlet 110 to the air outlet 120. The blades 230 transfer the intake airflow parallel to the axial direction of the blade structure 200 to the outward airflow along the radial direction of the hub 210, and the outward airflow is then expelled.

Still referring to FIG. 4, similar to the first embodiment, the second embodiment also has an indentation 160 in the curved portion 140 of the fan frame 100. The indentation 160 extends toward the air outlet 120 such that a part of the air inlet 110 is not a circular configuration, and the indentation 160 can dissipate the adverse airflow in the vicinity of the curved portion 140 in the airflow passage. Further, as the adverse airflow does not interfere with the intake airflow or the later air outflow, the air outflow of the air outlet 120 is more balanced and the air outflow is increased.

Also referring to FIG. 4, the heat dissipation module also includes a heat-conduction plate 500, a board extended from a lateral side of the fan frame 100, so as to load the heat source. The heat source, such as a CPU, is disposed on the heat-conduction plate 500 and adjacent to the heat dissipation module such that the heat-conduction plate 500 can absorb the heat from the heat source. Additionally, the air outlet 120 of the heat dissipation module is disposed with a plurality of fins 180. The fins 180 are made of metallic material such as aluminum, aluminum alloy or aluminum-magnesium alloy. The heat-conduction plate 500 of the heat dissipation module further includes a heat pipe 170 adjacent to the heat source, and the heat pipe 170 is extended from the heat-conduction plate 500 to the fins 180. Therefore, the heat from the heat source can be dissipated by way of the blowing of the airflow driven by the blade structure 200.

Noticeably, as the heat dissipation module is disposed in a heat source, the outer shell portion of the heat source (such as a portable computer) can be used as the cap of the heat dissipation module. Additionally, the air inlet of the heat dissipation module is formed on the outer shell of the heat source, and an indentation is formed on the outer shell to dissipate the adverse airflow in the vicinity of the curved portion in the airflow passage. Alternatively, the air inlet can be provided by the heat source.

The Third Embodiment

Figure 5:
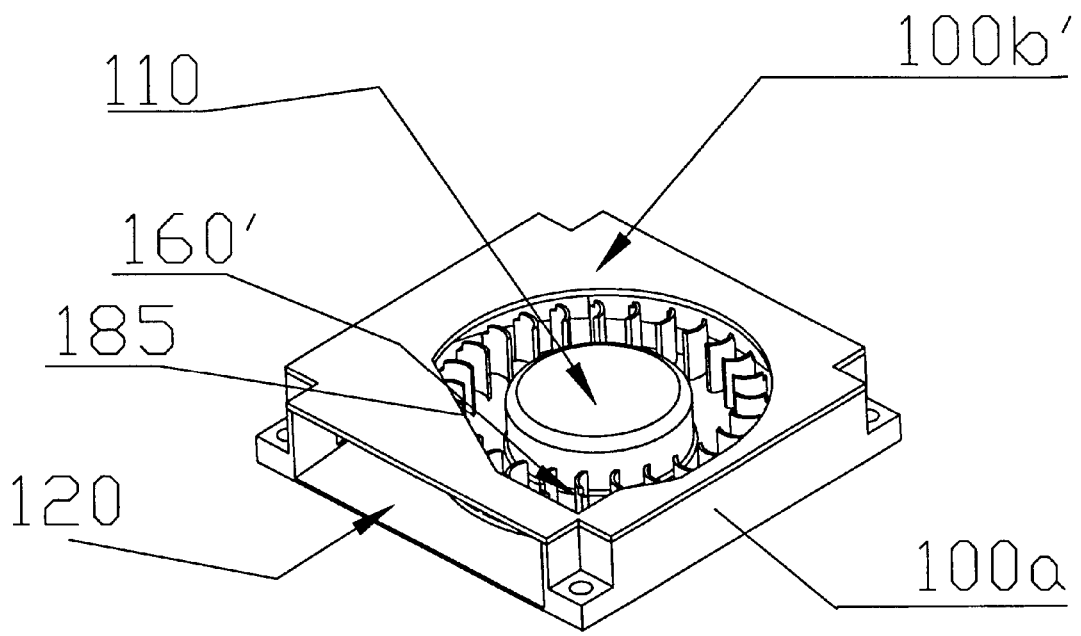
FIG. 5 is a schematic perspective view of the third embodiment of the invention.

Referring to FIG. 5, the heat dissipation device of the third embodiment is similar to that of the first embodiment. Thus, the same elements are denoted with the same symbols.

The third embodiment differs from the first embodiment in that the cap 100*b*' further has a slant side 185 formed adjacent to the indentation 160'. Similar to the indentation 160', the slant side 185 can also be used to further dissipate the adverse airflow so as to balance the air outflow and enhance the efficiency of heat dissipation.

The present invention is not limited to the specifically disclosed embodiment; variations and modifications may be made without departing from the scope of the present invention, and all changes that fall within the bounds of the claims, or equivalence of such bounds are intended to be embraced by the claims.

What is claimed is:

1. A heat dissipation device, comprising:

a fan frame having a curved portion, an air inlet, and an air outlet corresponding to the air inlet, wherein a part of the air inlet adjacent to the curved portion has a non-arc configuration and an indentation extended toward the air outlet; and a blade structure disposed in the fan frame.

2. The heat dissipation device as claimed in claim 1, wherein the blade structure includes a centrifugal fan.

3. The heat dissipation device as claimed in claim 1, wherein the blade structure is disposed in a recess of the fan frame.

4. The heat dissipation device as claimed in claim 1, wherein a slant side is formed adjacent to the indentation.

* * * * *